United States Patent
Kilian et al.

(10) Patent No.: US 7,626,377 B2
(45) Date of Patent: Dec. 1, 2009

(54) HALL-EFFECT DEVICE WITH MERGED AND/OR NON-MERGED COMPLEMENTARY STRUCTURE

(75) Inventors: Wayne T. Kilian, Richardson, TX (US); Gilberto Morales, Arlington, TX (US)

(73) Assignee: Honeywell International Inc., Morristown, NJ (US)

( * ) Notice: Subject to any disclaimer, the term of this patent is extended or adjusted under 35 U.S.C. 154(b) by 9 days.

(21) Appl. No.: 12/032,763

(22) Filed: Feb. 18, 2008

(65) Prior Publication Data

US 2009/0206424 A1 Aug. 20, 2009

(51) Int. Cl.
*G01R 15/20* (2006.01)
(52) U.S. Cl. .................................. 324/117 H
(58) Field of Classification Search ............. 324/117 H, 324/117 R, 126, 765, 158.1, 763; 257/401, 257/421, 426; 73/204.26; 438/14–18
See application file for complete search history.

(56) References Cited

U.S. PATENT DOCUMENTS

| 3,994,010 | A | 11/1976 | Geske | 357/27 |
| 4,025,941 | A | 5/1977 | Kanda et al. | 357/27 |
| 4,660,065 | A | 4/1987 | Carvajal et al. | |
| 4,673,964 | A * | 6/1987 | Popovic et al. | 257/427 |
| 4,829,352 | A | 5/1989 | Popovic et al. | |
| 5,119,166 | A | 6/1992 | Sridhar | 357/60 |
| 5,528,067 | A * | 6/1996 | Farb | 257/401 |
| 5,614,754 | A | 3/1997 | Inoue | 257/421 |
| 2005/0230769 | A1 | 10/2005 | Lilian et al. | |
| 2006/0157809 | A1 | 7/2006 | Alimi et al. | |

\* cited by examiner

*Primary Examiner*—Minh N. Tang
*Assistant Examiner*—Tung X Nguyen
(74) *Attorney, Agent, or Firm*—Kermit D. Lopez; Luis M. Ortiz (57) ABSTRACT

A Hall-effect device with a merged and/or non-merged complementary structure in order to cancel stress induced offsets includes an n-type epitaxial Hall element and a p-type Hall element. The p-type Hall element can be implanted directly on top of the n-type epitaxial Hall element. The merged Hall elements can be biased in parallel to provide a zero-bias depletion layer throughout for isolation. The output of the p-type Hall element can be connected to the geometrically corresponding output of the n-type epitaxial Hall element through a suitable resistance. The output signal can be taken at the outputs of the n-type element. The Hall-effect device can be constructed utilizing standard processes.

20 Claims, 8 Drawing Sheets

HALL-EFFECT DEVICE WITH MERGED AND/OR NON-MERGED COMPLEMENTARY STRUCTURE

TECHNICAL FIELD

A Hall-effect device generally includes one or more Hall elements operable based on Hall-effect technology. Embodiments are generally related to Hall-effect devices. Embodiments are also related to Hall-effect magnetic-based sensors. Embodiments also relate to merged and/or non-merged complementary structures.

BACKGROUND OF THE INVENTION

Various semiconductor devices have been designed, fabricated and mass-produced utilizing the well known Hall-effect technology. Hall-effect semiconductor devices are temperature-compensated magnetic field sensing products. Such components are best suited for use in extremely harsh environments and for detecting position in automotive, industrial and commercial applications, including robotics where the identification of objects and/or counting the rotations of gears is required. A typical Hall-effect device relies on a magnetic field in order to sense position and can be fabricated utilizing integrated circuit) technology. A Hall-effect device generally includes one or more Hall elements operable based on Hall-effect technology.

The Hall-effect refers to a measurable voltage that appears across a conductive material, for example, a thin layer of n-or-p-doped silicon, when an electric current flowing through the conductor is influenced by the magnetic field. Under these conditions a transverse voltage is generated perpendicular to the applied current due to balancing of Lorentz and electromagnetic forces. The Hall-effect element includes bias current providing contacts and voltage-signal sensing contacts that are disposed on the semiconductor. The sensing contacts of the Hall-effect element provides an output signal that is responsive to the magnitude of the magnetic field extending perpendicular to the surface of the thin conductive layer.

The majority of prior art Hall-effect devices produce an undesirable offset voltage, in response to mechanical stress due to anisotropic piezoresistance in silicon Hall cells. For example, most Hall devices are encapsulated in a suitable housing or package for protection of the Hall element. The Hall-effect device is typically mounted on a substrate and encapsulated in a protective body such as epoxy, plastic or the like. As the mounting substrate and the encapsulation material generally possesses different coefficients of thermal expansion and elastic moduli which are also different from the coefficient of thermal expansion and elastic modulus of silicon. Hence, mounting and encapsulation of the silicon chip results in mechanical stresses on the chip. Since silicon is piezoresistive, physical stresses placed on the chip alter its electrical resistance characteristics resulting in voltage offsets produced by mechanical stress rather than Hall-effect.

The offset voltage generally refers to an output voltage even in the absence of the magnetic field voltage, which occurs when there are physical inaccuracies and material non-uniformities. Similarly, process variations in the fabrication of the Hall-effect element may cause local variations in resistance. Further, unbalance in the subsequent amplifiers typically utilized with Hall-effect elements also can contribute to voltage offset. While the offset voltage is usually quite small, it can be large enough to affect the proper operation of the Hall-effect element.

A trimmer network is typically provided to balance the resistance variations. For example, the trimmer network may include a current mirror with trimmable degeneration resistors. The problem associated with these trimmer networks is that the trimmer networks with their associated compensation devices increase the size and complexity of the Hall-effect elements, both in terms of fabrication and operation. The trimming resistors formed in the integrated circuit chip cannot be utilized to further adjust voltage offsets after the device has been encapsulated. The prior art approaches are somewhat satisfactory for gross adjustments to predeterminable voltage offsets but they suffer from lack of reproducibility and sensitivity to packaging process parameters.

Based on the foregoing it is believed that a need exists for an improved Hall-effect device with merged complementary structure in order to cancel stress induced offsets as disclosed in further detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved Hall-effect devices.

It is another aspect of the present invention to provide for improved Hall-effect magnetic sensors.

It is further aspect of the present invention to provide for an improved Hall-effect device with merged complementary structures in order to cancel stress induced offsets.

The aforementioned aspects and other objectives and advantages can now be achieved as described herein. A Hall-effect device with merged complementary structure in order to cancel stress induced offsets includes an n-type epitaxial Hall element and a p-type Hall element. The p-type Hall element can be implanted directly on top of the n-type epitaxial Hall element. The merged Hall elements can be biased in parallel to provide a zero-bias depletion layer throughout for isolation. The output of the p-type Hall element can be connected to the geometrically corresponding output of the n-type epitaxial Hall element through a suitable resistance. An output signal can be taken at the outputs of the n-type element. The Hall-effect device can be constructed utilizing standard processes.

An insulating layer can be disposed on the p-type Hall element. A conductive material to act as a field plate can be disposed on the insulating layer and can be coupled to a voltage source to control depletion and accumulation of charge carriers at the surface of the active layers by guarding the layers from the influences of external electric fields. The Hall mobility of holes in the p-type silicon Hall element is about 15% of the Hall mobility for electrons in the n-type element, and also the piezoresistance coefficient for shear stress in the p-type element is generally inverted from, and an order of magnitude greater than, that of the n-type element. Similarly, in the presence of applied shear stress, p-type Hall elements have inferior signal-to-offset performance compared to n-type elements. Hence, the differences between p-type and n-type can ideally be utilized to completely cancel stress-induced offset while maintaining approximately 83% of the n-type Hall voltage signal. The improved structure proposed in this invention can allow Hall-effect devices to be constructed with improved offset or symmetry statistics that support design optimizations for higher performance and improved yield.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
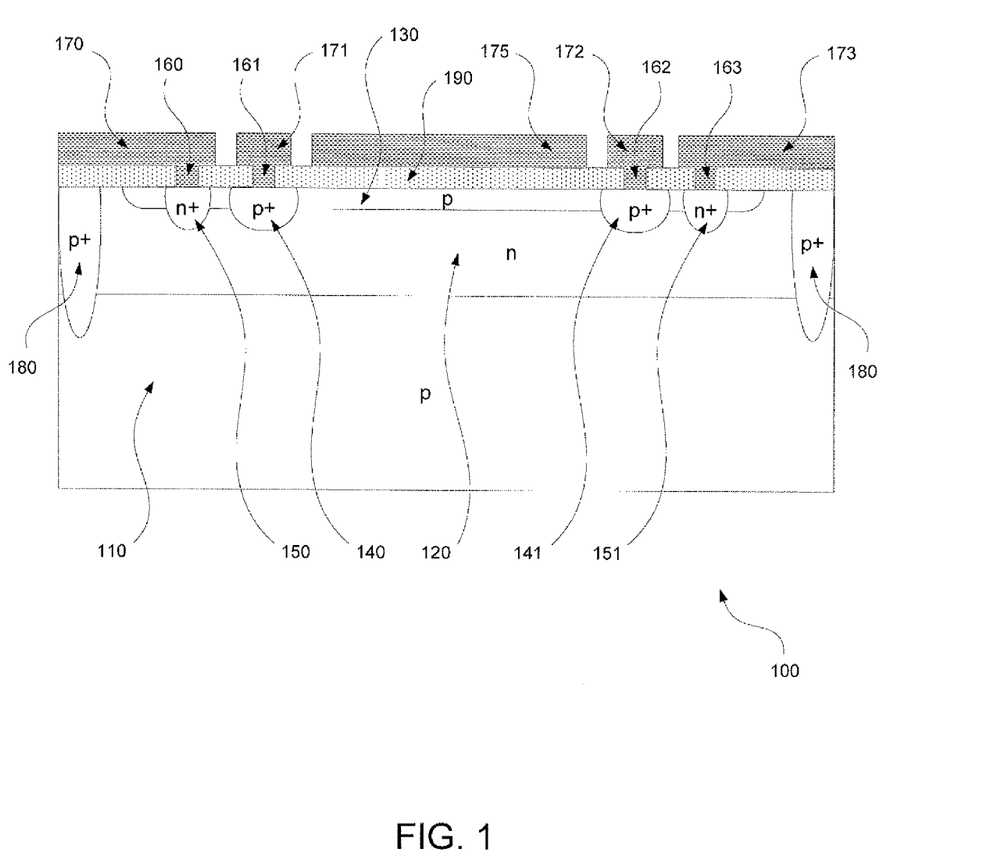
FIG. 1 illustrates a sectional view of a Hall-effect device with merged complementary structure, which can be implemented in accordance with a preferred embodiment.
Figure 2:
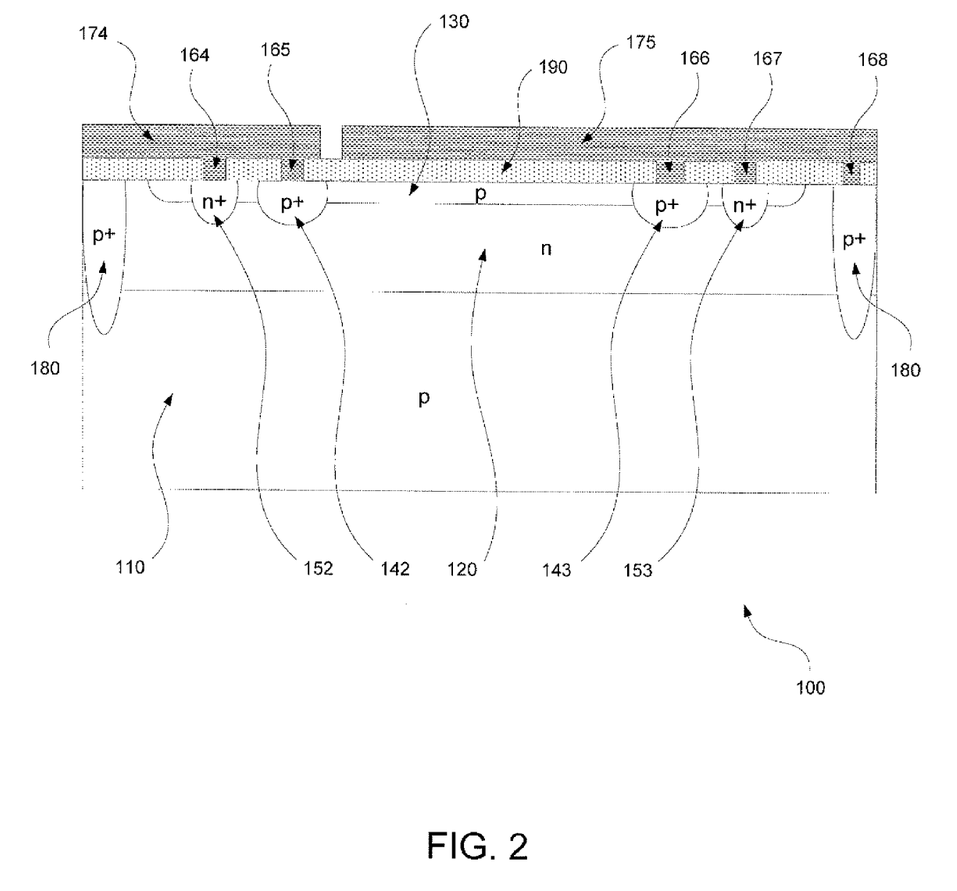
FIG. 2 illustrates another sectional view of a Hall-effect device with merged complementary structure, which can be implemented in accordance with a preferred embodiment.

FIG. 1 and FIG. 2 represent sectional views (not to scale) of a Hall-effect device having a merged complementary structure. These sectional views are depicted at right angle to one another. FIG. 1 illustrates internal structures along a section that passes through the signal output terminals of the n-type and p-type Hall elements. FIG. 2 depicts internal structures along a section that passes through the bias terminals of the n-type and p-type Hall elements. Heavily doped n-type and p-type diffused layers are indicated as n+ and p+ in FIG. 1 and FIG. 2.

Referring to FIG. 1, a sectional view of a Hall-effect device with merged complementary structure 100 is illustrated, which can be implemented in accordance with a preferred embodiment. The Hall-effect device 100 can be formed on a semiconductor body made of silicon, utilizing silicon integrated circuit technology. A p-type substrate 110 can be formed as a base for the Hall-effect magnetic device 100. The Hall-effect device 100 generally includes a p-type substrate layer 110 upon which an epitaxial layer or an n-type Hall element 120 can be formed. A p-type layer or a p-type Hall element 130 can be implanted directly on top of the n-type epitaxial Hall element 120.

An isolating layer 180 bounds the entire perimeter of the n-type epitaxial Hall element 120 and surrounds the p-type Hall element 130. The isolating layer 180 is preferably p-type silicon, and the n-type Hall element 120 is preferably formed within a region of an n-type epitaxial silicon layer that can be grown on the p-type substrate 110. The isolating layer 180 can be formed by diffusing p-type impurities extending down through the n-type epitaxial layer and into the p-type substrate 110 and can provide electrical isolation. The isolating layer 180 can be biased with a negative voltage potential with respect to the n-type Hall element 120 to isolate Hall elements 120 and 130 from other circuit elements. Additionally, an insulating layer 190 can be formed above the n-type epitaxial layer 120. The insulating layer 190 can be for example, silicon dioxide.

An electrically conductive material can be formed on top of the insulating layer 190. The conductive layer can be for example, mostly aluminum or polysilicon. The conductive layer can be partitioned into separate regions 170, 171, 172, 173 and 175, configured to provide electrical interconnection to the Hall Effect device 100. The insulating layer 190 can be selectively removed to respectively configure electrical contacts 160, 161, 162 and 163 between interconnection conductors 170, 171, 172 and 173 and the underlying silicon layers 150, 140, 141, 151. Silicon layers 150 and 151 can be formed from heavily doped n-type diffusions to support ohmic conduction between the n-type Hall element 120 and conductors 170 and 173.

Silicon layers 140 and 141 can be formed from heavily doped p-type diffusions to support ohmic conduction between the p-type Hall element 130 and conductors 171 and 172. Conductors 170 and 173 can be used to connect the n-type Hall element differential output signal to an electrical circuit. Conductors 171 and 172 can be used to connect the p-type Hall element differential output signal to an electrical circuit. Electrical connections from conductor 175 to the silicon underlayers are not apparent in this sectional view.

Referring to FIG. 2, a sectional view of a Hall-effect device with merged complementary structure 100 is illustrated, which can be implemented in accordance with a preferred embodiment. Descriptions of the p-type substrate layer 110, epitaxial layer comprising the n-type Hall element 120, p-type implanted layer 130 and isolation diffusion 180 are as in the detailed description of FIG. 1. An insulating layer 190 can be formed above the n-type epitaxial layer. The insulating layer 190 can be for example, silicon dioxide.

An electrically conductive material can be formed on top of the insulating layer 190. The conductive layer can be for example, mostly aluminum or polysilicon. The conductive layer can be partitioned into separate regions 174 and 175, configured to provide electrical connection to the n-type and p-type Hall elements. The insulating layer 190 can be selectively removed to configure electrical contacts 164 and 165 between conductor 174 and the underlying silicon layers 152 and 142. Additionally, insulating layer 190 can be selectively removed to configure electrical contacts 166, 167 and 168 between conductor 175 and the underlying silicon layers 143, 153 and 180.

Silicon layers 152 and 153 can be formed from heavily doped n-type diffusions to support ohmic conduction between the n-type Hall element 120 and conductors 174 and 175. Silicon layers 142 and 143 can be formed from heavily doped p-type diffusions to support ohmic conduction between the p-type Hall element 130 and conductors 174 and 175. Conductors 174 and 175 can be used to connect the n-type and p-type Hall elements to an external power source. Silicon layer 180 can be formed from a heavily doped p-type diffusion to support ohmic conduction to conductor 175. Reverse bias can be provided across the n-type epitaxial layer and the p-type isolating layer to provide electrical isolation; conductor 174 can be biased at a voltage potential that is positive with respect to conductor 175 to isolate the two Hall elements 120 and 130 from other circuit elements.

Sufficient electrical isolation between the n-type and p-type Hall elements 120 and 130 can be achieved by arranging bias connection conductors 174 and 175 to power the n-type and p-type Hall elements in parallel. This parallel bias configuration produces a nearly zero-bias depletion region between the n-type and p-type Hall elements.

Figure 3:
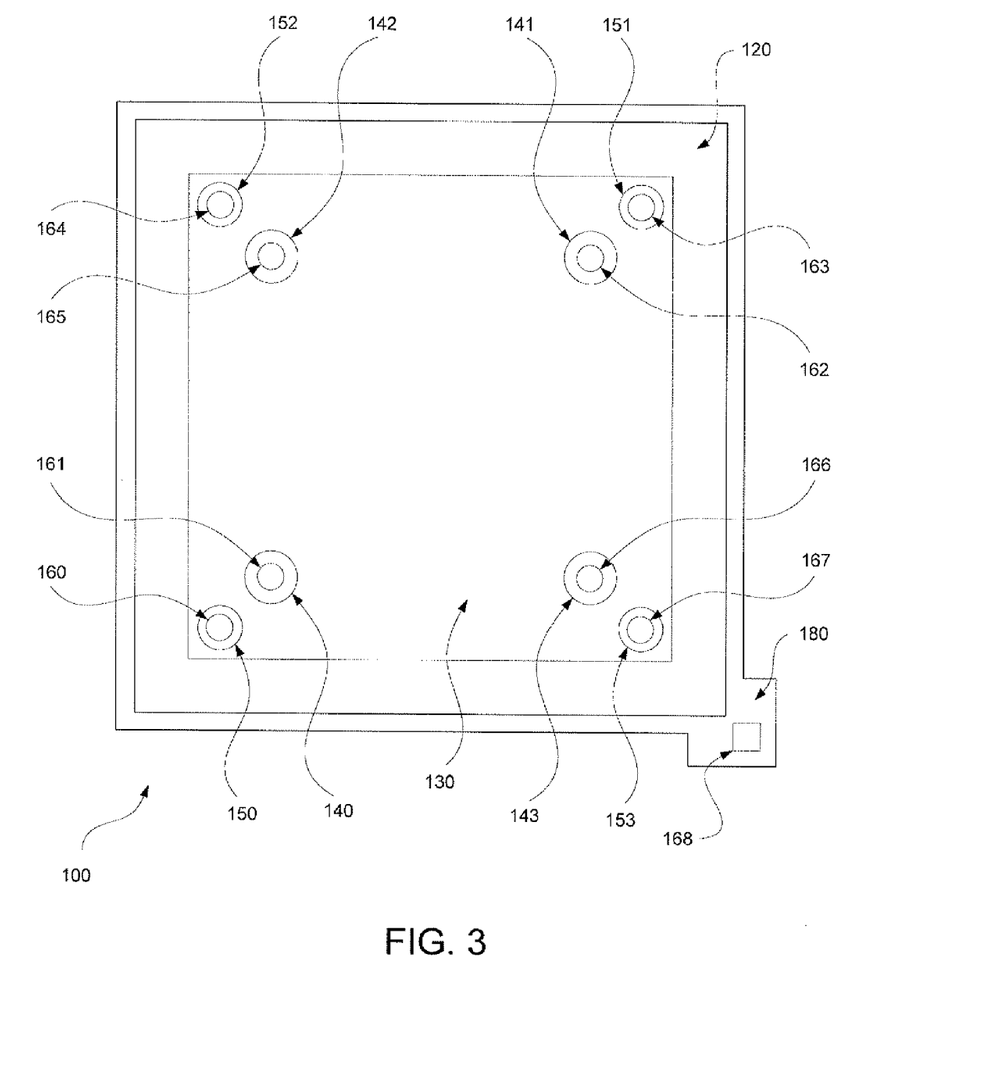
FIG. 3 illustrates a schematic top view of the Hall-effect device with merged complementary structure, which can be implemented in accordance with a preferred embodiment.

Referring to FIG. 3, a schematic top view of the Hall-effect device 100 with improved complementary structure is illustrated, which can be implemented in accordance with a preferred embodiment. Descriptions of the epitaxial layer comprising the n-type Hall element 120, the p-type implanted layer 130, p-type diffusions 140, 141, 142 and 143, n-type diffusions 150, 151, 152, and 153, contact openings 160, 161, 162, 163, 164, 165, 166, 167 and 168, and isolation diffusion 180 are as in the detailed description of FIG. 1 and FIG. 2. The sectional view in FIG. 1 relates to a section from the lower left-hand corner to the upper right-hand corner of Hall device 100 in FIG. 3. The sectional view in FIG. 2 relates to a section from the upper left-hand corner to the lower right-hand corner of Hall device 100 in FIG. 3.

Figure 4:
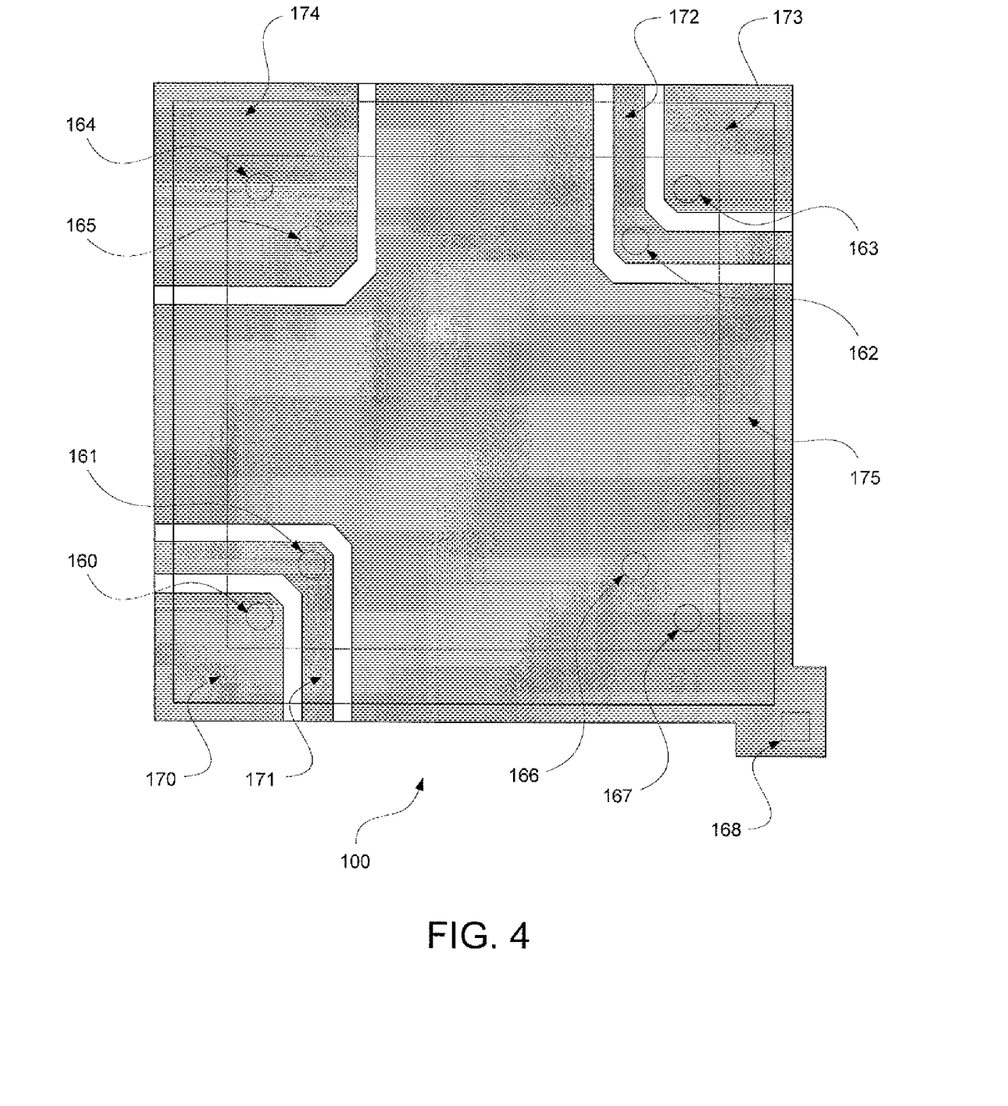
FIG. 4 illustrates another schematic top view of the Hall-effect device, which can be implemented in accordance with a preferred embodiment.

FIG. 4 illustrates an alternative schematic view of the Hall-effect device 100 with merged complementary structure in accordance with a preferred embodiment. Descriptions of the contact openings 160, 161, 162, 163, 164, 165, 166, 167 and 168, and conductors 170, 171, 172, 173 and 174 are as in the detailed description of FIG. 1 and FIG. 2. Interconnection conductor 175 can connect the two merged Hall elements and the isolating diffusion (see component 180 in FIG. 1-FIG. 3) to the low-potential side of an external power source through contact openings 166, 167 and 168. Conductor 175 can also cover the surface area of Hall device 100 that is not covered by conductors 170, 171, 172, 173 and 174, to act as a field plate. Substantial surface accumulation and depletion layers can exist in lightly doped silicon layers at the silicon-insulator interface, in response to electric fields. In particular, the n-type epitaxial layer and to a lesser degree the implanted p-type layer (i.e., components 120 and 130 respectively depicted in FIG. 1-FIG. 3) are susceptible to modulation of sheet conductivity due to these field induced surface layers.

In the presence of locally non-uniform fields, the resulting local variation in sheet conductivity can produce error signals at the output of either the n-type or p-type Hall elements. Conductor 175 is configured to guard the underlying layers from external electric fields, thereby controlling the error signals. The field effects that remain, due to charges in the insulating layer (i.e., see component 190 in FIG. 1-FIG. 3) and work function differences between the silicon and conductor 175, are mainly uniform and so produce only small, relatively stable offset signals from the Hall elements.

Figure 5:
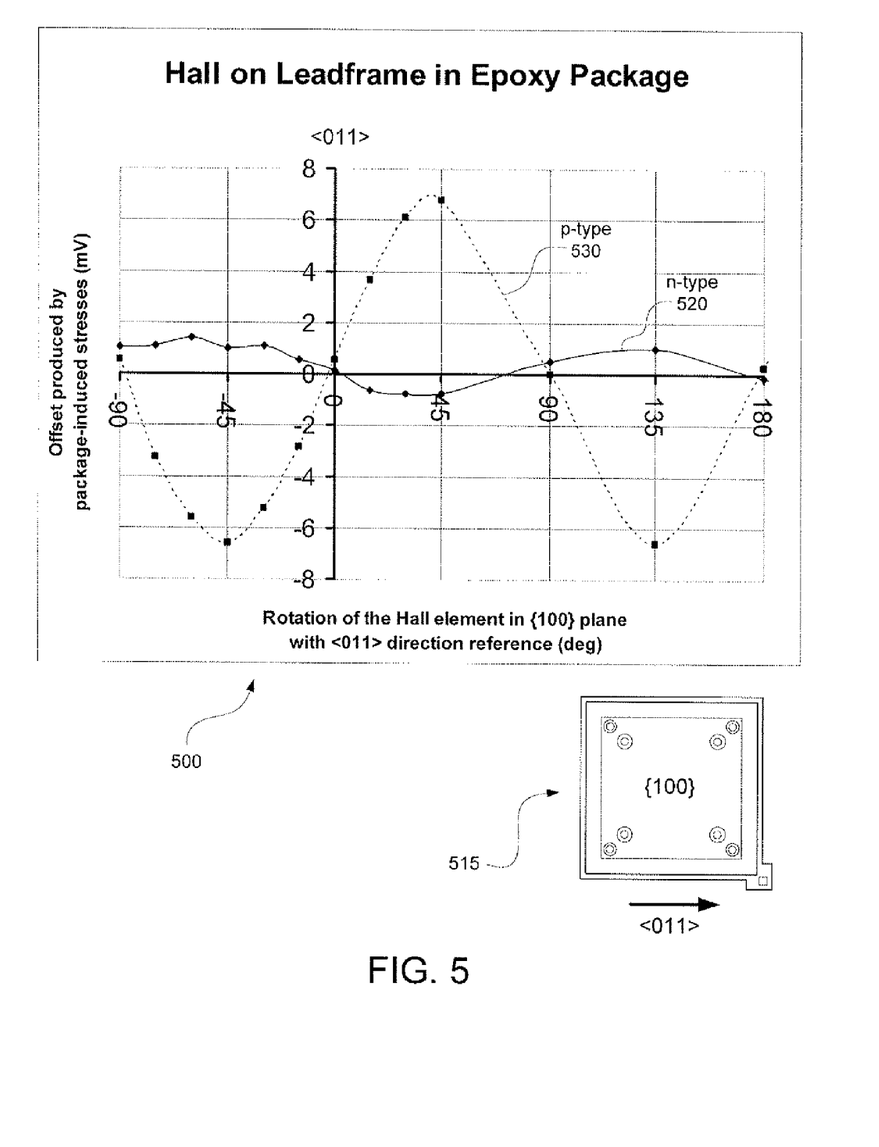
FIG. 5 illustrates a graph illustrating offset produced by packaging stresses of a p-type and an n-type Hall element, which can be implemented in accordance with a preferred embodiment.

FIG. 5 illustrates a graph 300 illustrating finite element modeling results of offset produced by packaging stresses, of p-type and n-type Hall elements biased at 5 volts dc, in accordance with a preferred embodiment. The graph 500 depicts the offset produced by packaging stresses for n-type 520 and p-type 530 with respect to the rotation of the Hall elements in a {100} crystallographic plane. The zero-degree reference in graph 500 is with respect to a <011> direction in a {100} plane. Inset 515 in FIG. 5 illustrates the reference orientation in graph 500 with a schematic top view of the Hall-effect device with improved complementary structure 100, with respect to a <011> direction vector.

Mechanical stress can alter the resistivity of a crystalline material such as silicon. In particular, the resistivity of n-type and p-type silicon layers in a {100} plane can individually vary with applied stress due to the anisotropic piezoresistance. Local differences in the resistivity within a Hall cell can result in an offset voltage at the output of the cell. The simulation results in graph 500 represent the net responses of the n-type and p-type Hall elements to applied mechanical stresses acting through the various piezoresistance coefficients, These results indicate that a proportioned summation of the n-type and p-type Hall cell outputs can produce a combined offset with reduced magnitude.

Figure 6:
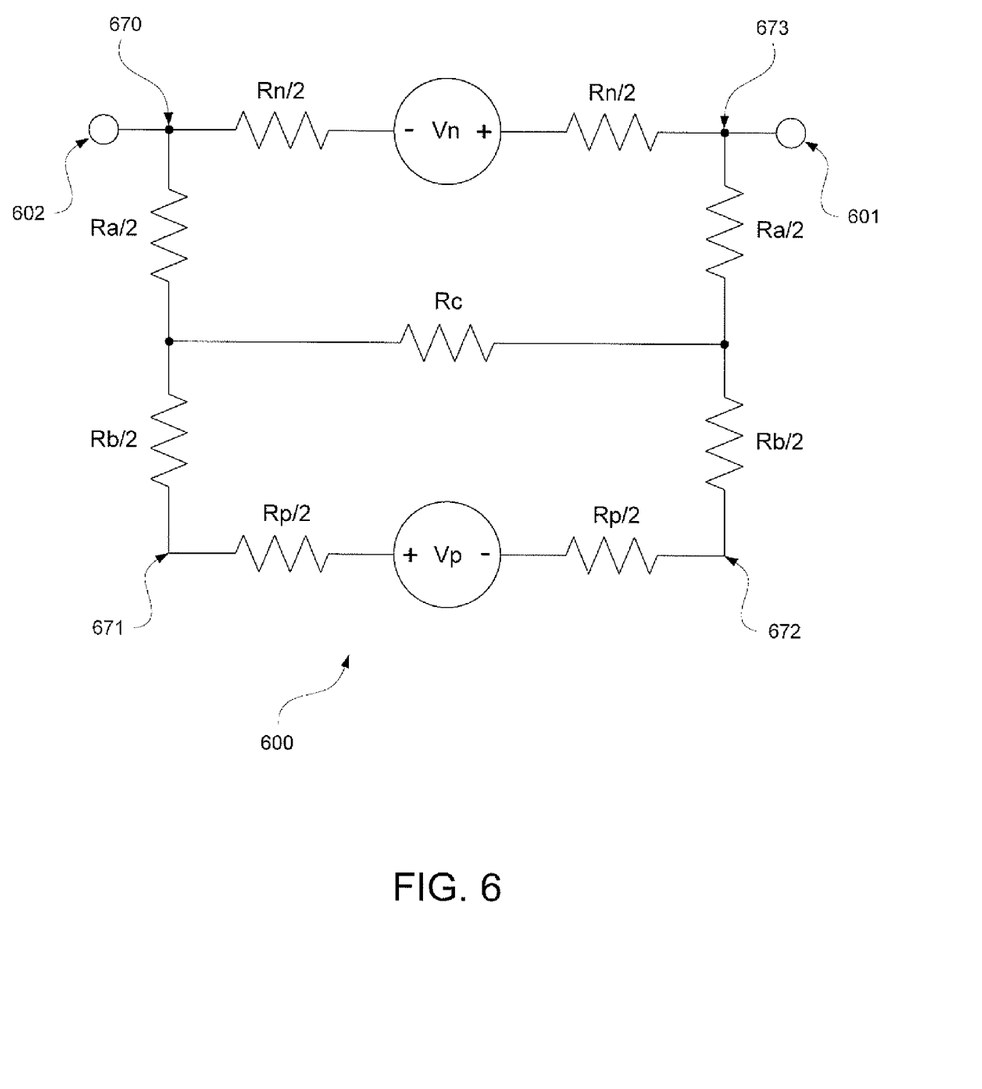
FIG. 6 illustrates a schematic view of a resistive network for combining the outputs of a p-type and an n-type Hall element, which can be implemented in accordance with a preferred embodiment.

Referring to FIG. 6, a schematic view of a resistive network 600 connecting outputs of n-type and p-type Hall elements, which can be adapted for use with the Hall-effect device with merged complementary structure, is illustrated, in accordance with a preferred embodiment. The n-type and p-type Hall elements are represented as Thévenin-equivalent models. Voltage source Vn and resistance Rn represents the n-type Hall element. Voltage source Vp and resistance Rp represents the p-type Hall element. The polarities indicated on voltage sources Vn and Vp reference the Hall voltage signals in response to an applied magnetic field vector normal to the surface of the Hall-effect device 100, as illustrated in FIG. 3 and FIG. 4, and in accordance with FIG. 1 and FIG. 2.

Circuit nodes 670, 671, 672 and 673 respectively correspond with interconnect conductors 170, 171, 172 and 173 in FIG. 1 and FIG. 4. Resistors Ra, Rb and Rc can act together as a network, to proportion and sum the n-type and p-type Hall element outputs. Resistance values can be chosen for Ra, Rb, and Rc that will provide optimal cancellation of the combined offset signals at output terminals 601 and 602. The resistor network including Ra, Rb, and Rc can be configured with the Hall-effect device with merged complementary structure 100 as a monolithic integrated circuit. Resistors Ra, Rb and Rc can be integrated using specific n-type or p-type layers for each, to provide temperature compensation of the resultant offset at output terminals 601 and 602. In one embodiment and with references to FIG. 3, resistor Ra can be constructed from the same p-type layer as diffusions 140, 141, 142 and 143 in FIG. 3, Rb can be constructed from the same p-type implanted layer as Hall element 130 and Rc can be constructed from the same n-type epitaxial layer as Hall element 120. The resistor network can be located within the n-type epitaxial layer, in a region outside of the n-type Hall element boundary established by p-type isolating layer 180.

Figure 7:
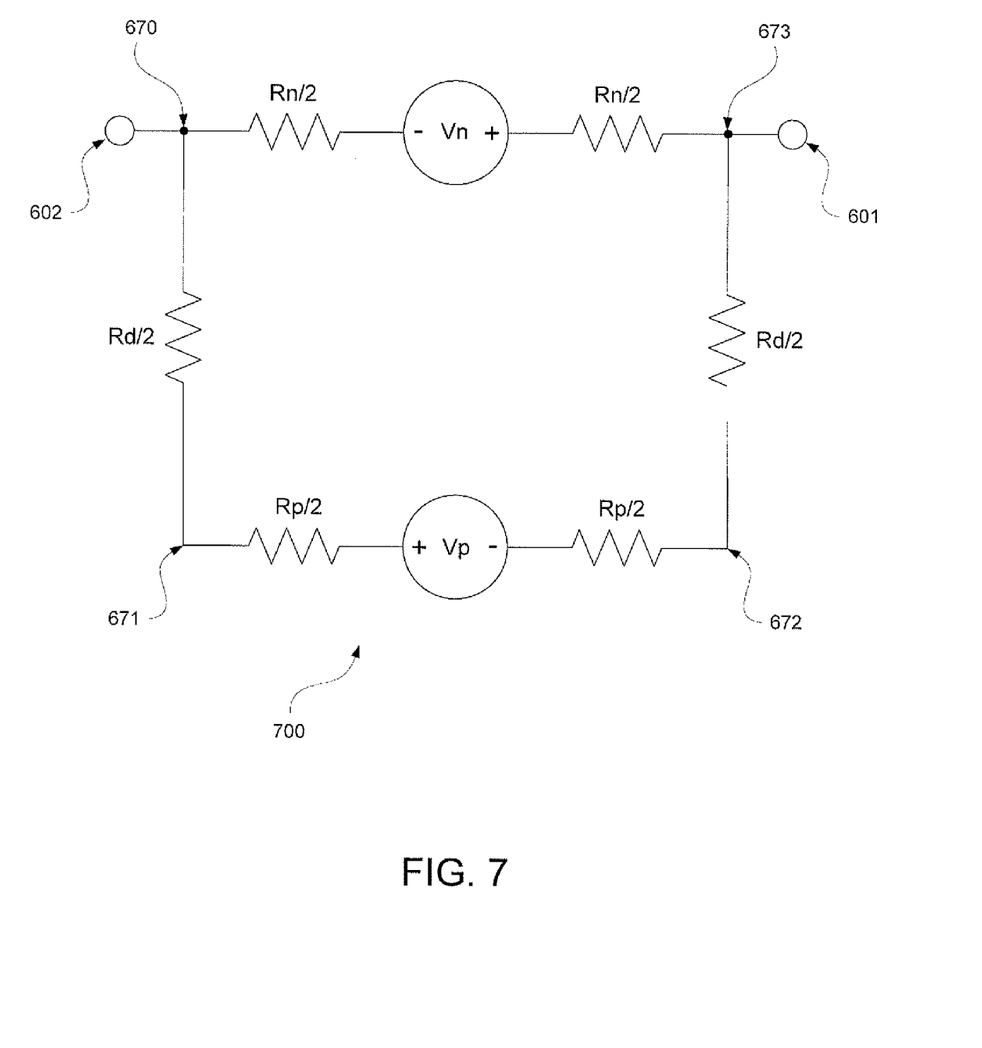
FIG. 7 illustrates a schematic view of a resistive network for combining the outputs of a p-type and an n-type Hall element, which can be implemented in accordance with an alternate embodiment.

Referring to FIG. 7, a schematic view of a resistive network 700 connecting outputs of n-type and p-type Hall elements, which can be adapted for use with the Hall-effect device with merged complementary structure, is illustrated, in accordance with an alternate embodiment. Descriptions of the Vn, Rn and Vp, Rp Thévenin-equivalent models and circuit nodes 670, 671, 672 and 673, are as in the detailed description of FIG. 6. A value can be chosen for resistance Rd that will provide optimal cancellation of the combined offset signals at output terminals 601 and 602.

Figure 8:
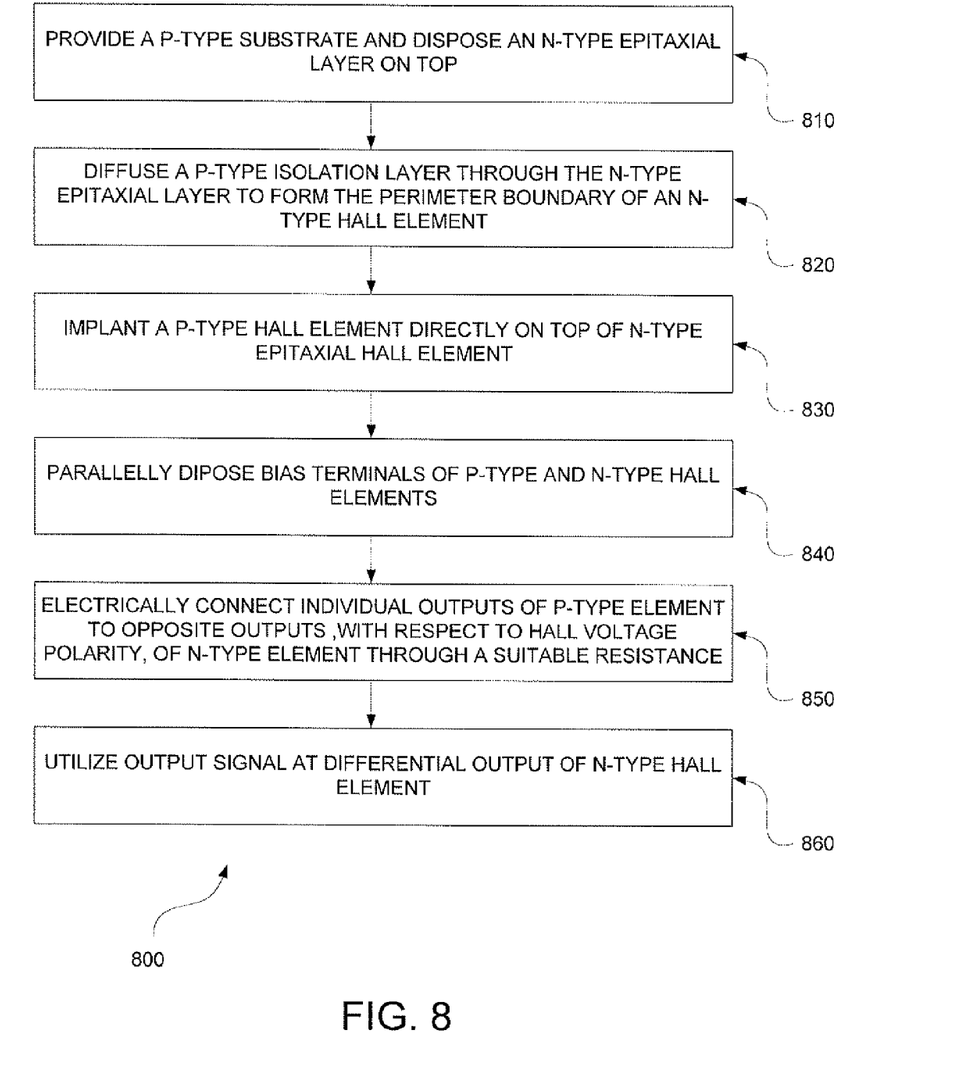
FIG. 8 illustrates a detailed flow chart of operations illustrating logical operational steps of a method for constructing the Hall-effect device with merged complementary structure, which can be implemented in accordance with a preferred embodiment.

Referring to FIG. 8, a detailed flow chart of operations illustrating logical operational steps of a method 800 for constructing the Hall-effect device 100 with merged complementary structure is illustrated, which can be implemented in accordance with a preferred embodiment. Note that in FIGS. 1-7, identical or similar parts or elements are generally indicated by identical reference numerals. As indicated at block 810, a p-type substrate can be provided and an n-type epitaxial layer can be disposed above the p-type substrate. As indicated in block 820, a p-type layer can be diffused down through the n-type epitaxial layer to provide for electrical isolation of an area of the epitaxial layer that forms the n-type Hall element 120. Next, as depicted at block 830, a p-type hall element 130 can be implanted directly on top of n-type epitaxial hall element 120. The bias terminals 160 and 165 of the p-type element 130 and the bias terminals 162 and 167 of the n-type element 120 can be disposed in parallel, as shown at block 840.

Each output of the p-type element 130 can be geometrically connected to the adjacent output of the n-type element 120 through a suitable resistance such as resistance Rd/2 in FIG. 7. In terms of output polarities, the differential outputs of the p-type and n-type Hall elements can be coupled through a resistive network that will destructively combine the n-type and p-type Hall voltage signals and stress induced offsets, as described at block 850. The output signal is available at the differential output terminals 601 and 602 in FIG. 6 and FIG. 7 of the n-type element 120, as depicted at block 860. The merging of the p-and-n-type Hall elements 130 and 120 can allow magnetic sensors based on the Hall effect to be constructed with improved offset or symmetry statistics that support design optimizations for higher performance and improved yield.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A Hall-effect apparatus having a complementary structure comprising; an n-type epitaxial Hall element, wherein said n-type epitaxial Hall element comprises a first pair of sensing contacts disposed on a substrate layer, said n-type epitaxial Hall element surrounded vertically by an isolation layer;
   a p-type Hall element comprising a second pair of sensing contacts implanted on a region of said n-type epitaxial layer isolated from said n-type epitaxial Hall element, wherein said n-type epitaxial Hall element and said p-type Hall element are biased in a parallel arrangement in order to provide similar quiescent output voltages thereof; and
   an insulation layer associated with a plurality of conductors disposed above said n-type epitaxial Hall element and said p-type Hall element, thereby geometrically connecting said second pair of sensing contacts to said first pair of sensing contacts through a resistive network and providing an output signal thereof through said first pair of sensing contacts.

2. The apparatus of claim 1 wherein said n-type epitaxial Hall element and said p-type Hall element comprise a pair of electrical bias contacts.

3. The apparatus of claim 1 wherein said n-type epitaxial Hall element is arranged in a non-merged configuration with respect to said p-type Hall element.

4. The apparatus of claim 1 wherein said resistive network is configured to restrict variation in a magnitude of said output signal in response to temperature changes.

5. The apparatus of claim 1 wherein said output signal comprises a voltage signal indicative of said n-type epitaxial Hall element.

6. The apparatus of claim 1 wherein said n-type epitaxial Hall element and said p-type Hall element are configured on a semiconductor body comprising silicon and utilizing a silicon integrated circuit technology.

7. A Hall-effect apparatus having a merged complementary structure, comprising;
   an n-type epitaxial Hall element comprising a first pair of sensing contacts disposed on a substrate layer, wherein said n-type epitaxial Hall element is surrounded vertically by an isolation layer;
   a p-type Hall element comprising a second pair of sensing contacts implanted directly on said n-type epitaxial Hall element, wherein said n-type epitaxial Hall element and said p-type Hall element are biased in a parallel arrangement in order to provide a zero-bias depletion layer throughout for isolation; and
   an insulation layer associated with a plurality of conductors disposed above said p-type Hall element thereby geometrically connecting said second pair of sensing contacts to geometrically corresponding said first pair of sensing contacts through a suitable resistive network and taking an output signal through said first pair of sensing contacts.

8. The apparatus of claim 7 wherein said n-type epitaxial Hall element and said p-type Hall element comprise a pair of electrical bias contacts.

9. The apparatus of claim 7 wherein said n-type epitaxial Hall element is merged with said p-type Hall element so that an individual stress-induced offset is associated with destructively combining the offsets of said n-type epitaxial Hall element and said p-type Hall element.

10. The apparatus of claim 7 wherein said resistive network is configured to restrict a variation in a magnitude of said output signal in response to temperature changes.

11. The apparatus of claim 7 wherein said output signal comprises a voltage signal indicative of said n-type epitaxial Hall element.

12. The apparatus of claim 7 wherein said n-type epitaxial Hall element and said p-type Hall element are configured on a semiconductor body comprising silicon and utilizing a silicon integrated circuit technology.

13. The apparatus of claim 7 wherein:
   said n-type epitaxial Hall element and said p-type Hall element comprise a pair of electrical bias contacts;
   said n-type epitaxial Hall element is merged with said p-type Hall element so that an individual stress-induced offset is associated with destructively combining the offsets of said n-type epitaxial Hall element and said p-type Hall element; and
   said resistive network is configured to restrict a variation in a magnitude of said output signal in response to temperature changes.

14. The apparatus of claim 13 wherein said output signal comprises a voltage signal indicative of said n-type epitaxial Hall element and wherein said n-type epitaxial Hall element and said p-type Hall element are configured on a semiconductor body comprising silicon and utilizing a silicon integrated circuit technology.

15. A method of configuring a Hall-effect apparatus to comprise a merged complementary structure, comprising;
   configuring an n-type epitaxial Hall element to comprise a first pair of sensing contacts disposed on a substrate layer;
   surrounding said n-type epitaxial Hall element vertically by an isolation layer;
   configuring a p-type Hall element to comprise a second pair of sensing contacts implanted directly on said n-type epitaxial Hall element, such that said n-type epitaxial Hall element and said p-type Hall element are biased in a parallel arrangement in order to provide a zero-bias depletion layer throughout for isolation; and associating an insulation layer with a plurality of conductors disposed above said p-type Hall element thereby geometrically connecting said second pair of sensing contacts to geometrically corresponding said first pair of sensing contacts through a suitable resistive network and taking an output signal through said first pair of sensing contacts.

16. The method of claim 15 wherein said n-type epitaxial Hall element and said p-type Hall element comprise a pair of electrical bias contacts.

17. The method of claim 15 further comprising merging said n-type epitaxial Hall element with said p-type Hall element so that an individual stress-induced offset is associated with destructively combining the offsets of said n-type epitaxial Hall element and said p-type Hall element.

18. The method of claim 15 further comprising configuring said resistive network to restrict a variation in a magnitude of said output signal in response to temperature changes.

19. The method of claim 15 further comprising modifying said output signal to comprise a voltage signal indicative of said n-type epitaxial Hall element.

20. The method of claim 15 further comprising configuring said n-type epitaxial Hall element and said p-type Hall element on a semiconductor body comprising silicon and utilizing a silicon integrated circuit technology.

* * * * *